United States Patent
Tanaka (10) Patent No.: US 8,811,779 B2
(45) Date of Patent: Aug. 19, 2014

(54) LASER MODULE MANUFACTURING METHOD AND LASER MODULE

(75) Inventor: Hiromasa Tanaka, Tokyo (JP)

(73) Assignee: NEC Corporation, Tokyo (JP)

(*) Notice: Subject to any disclaimer, the term of this patent is extended or adjusted under 35 U.S.C. 154(b) by 135 days.

(21) Appl. No.: 13/424,489

(22) Filed: Mar. 20, 2012

(65) Prior Publication Data

US 2012/0269480 A1    Oct. 25, 2012

(30) Foreign Application Priority Data

Apr. 22, 2011 (JP) ................. 2011-095897

(51) Int. Cl.
| | |
|---|---|
| *G02B 6/12* | (2006.01) |
| *G02B 6/26* | (2006.01) |
| *G02B 6/10* | (2006.01) |
| *G02B 6/42* | (2006.01) |
| *G02B 6/43* | (2006.01) |

(52) U.S. Cl.
CPC .. *G02B 6/42* (2013.01); *G02B 6/43* (2013.01); *G02B 6/4244* (2013.01); *G02B 6/4245* (2013.01); *G02B 6/423* (2013.01)
USPC ................. 385/14; 385/50; 385/52; 385/129; 385/130

(58) Field of Classification Search
CPC ........ G02B 6/43; G02B 6/42; G02B 6/12004; G02B 6/423; G02B 6/4244; G02B 6/4245
USPC .......................... 385/14, 39, 50, 52, 129–132
See application file for complete search history.

(56) References Cited

U.S. PATENT DOCUMENTS

| | | | | |
|---|---|---|---|---|
| 5,780,875 A | * | 7/1998 | Tsuji et al. | ........ 257/81 |
| 6,344,148 B1 | * | 2/2002 | Park et al. | ......... 216/2 |
| 6,934,313 B1 | * | 8/2005 | Deacon | ........ 372/64 |

FOREIGN PATENT DOCUMENTS

| | | |
|---|---|---|
| JP | 08-304671 | 11/1996 |
| JP | 2000-231041 | 8/2000 |
| JP | 2005-017388 | 1/2005 |

* cited by examiner

*Primary Examiner* — Kaveh Kianni
*Assistant Examiner* — Hung Lam
(74) *Attorney, Agent, or Firm* — Young & Thompson (57) ABSTRACT

An optical semiconductor element is held in a junction-up state at an approach start position that is isolated from a mount face of a planar lightwave circuit, and the top-face height of the optical semiconductor element and the surface height of the planar lightwave circuit are aligned by bringing the optical semiconductor element closer towards the mount face. Further, the height of the active layer of the optical semiconductor element is aligned with the height of a waveguide of the planar lightwave circuit by bringing the optical semiconductor element towards the mount face for an amount of a difference between a reference value of a distance on design from the surface of the planar lightwave circuit to the center of the waveguide and a reference value of a distance on design from the top face of the optical semiconductor element to the center of the active layer.

4 Claims, 6 Drawing Sheets

LASER MODULE MANUFACTURING METHOD AND LASER MODULE

CROSS-REFERENCE TO RELATED APPLICATION

This application is based upon and claims the benefit of priority from Japanese patent application No. 2011-095897, filed on Apr. 22, 2011, the disclosure of which is incorporated herein in its entirety by reference.

BACKGROUND OF THE INVENTION

1. Field of the Invention

The present invention relates to a method for manufacturing a laser module that is constituted with a planar lightwave circuit and an optical semiconductor element, and to the laser module.

2. Description of the Related Art

As a laser module constituted with an optical semiconductor element and a planar lightwave circuit or an optical fiber instead of the planar lightwave circuit and, "Coupling Structure of Optical Semiconductor Element and Optical Transmission Path" disclosed in Japanese Unexamined Patent Publication 2000-231041 (paragraph 0015—paragraph 0016, FIG. 1) (Patent Document 1), "Optical Module" disclosed in Japanese Unexamined Patent Publication 2005-17388 (paragraph 0048—paragraph 0052, FIG. 1, FIG. 2) (Patent Document 2), and "Optical Transmitter/Receiver" disclosed in Japanese Unexamined Patent Publication Hei 8-304671 (paragraph 0011, FIG. 2, FIG. 4) (Patent Document 3), for example, are already known. The combined structure disclosed in Patent Document 1 is as follows. That is, an electrode pad is provided on a mount face that is formed on a planar lightwave circuit by notching a part of a planar lightwave circuit constituting a part of a laser module from a side of a waveguide forming face of the planar lightwave circuit towards the normal direction, and an optical semiconductor element constituting the other part of the laser module is mounted on the electrode pad in a junction-down state via a solder layer to align the height of an active layer of the optical semiconductor element with the height of the waveguide of the planar lightwave circuit in the normal direction of the waveguide forming face.

With this structure, the optical semiconductor element is mounted on the planar lightwave circuit in a junction-down state where the active layer of the optical semiconductor element is adjacent to the mount face of the planar lightwave circuit. Thus, it is possible to match the height of the active layer of the optical semiconductor element with the height of the waveguide of the planar lightwave circuit in the normal direction of the waveguide forming face without forming a deep notch from the surface of the waveguide forming face side of the planar lightwave circuit towards the normal direction. Since a deep notch is not required and the height of the active layer of the optical semiconductor element and the height of the waveguide of the planar lightwave circuit are originally close, there is such a merit that processing errors and assembling errors are not likely to occur. Meanwhile, the stress of the solder works on the active layer of the optical semiconductor element that is very close to the mount face of the planar lightwave circuit, so that oscillation of the laser becomes unstable and the SMSR property (Sub-Mode Suppression Ratio) becomes deteriorated.

In the meantime, in the optical module disclosed in Patent Document 2, an optical semiconductor element is attached in a junction-up state on a mount face that is formed on a V-groove substrate by notching the V-groove substrate for attaching an optical fiber from the top-face side towards the normal direction. Thus, it is necessary to align the height of an active layer of the optical semiconductor element and the height of the optical fiber on the V-groove substrate by deeply notching the V-groove substrate from the top-face side towards the normal direction. However, the active layer of the optical semiconductor element becomes isolated from the mount face on the V-groove substrate for the amount corresponding to the thickness of the optical semiconductor element, so that it is possible to overcome such inconvenience that the stress of a solder layer works directly on the active layer of the optical semiconductor element. This makes it possible to improve the SMSR property by stabilizing the oscillation of the laser.

With the optical module disclosed in Patent Document 2, in order to prevent redundancy of processing errors generated by deeply notching the V-groove substrate from the top-face side towards the normal direction and variation in the thickness of the optical semiconductor element, i.e., assembling errors generated depending on the variation in the isolated distance between the mount face and the active layer at last, a solder layer is interposed between the mount face of the V-groove substrate and the optical semiconductor element and the solder layer is crushed by pressing the surface of the active layer side of the optical semiconductor element on the surface of the mounting substrate until a surface of a mounting substrate (jig) that handles the optical semiconductor layer comes to abut against the surface on the active layer side of the optical semiconductor element and the top face (non-mount face) of the V-groove substrate simultaneously. Thereby, the optical semiconductor element is mounted to the mount face on the V-groove substrate in such a manner that the surface on the active layer side of the optical semiconductor element and the top face of the V-groove are on a same plane.

However, the heights actually need to be aligned are the height of the active layer of the optical semiconductor element and the height of the optical fiber on the V-groove substrate. Thus, it is not necessarily so important to have the surface on the active layer side of the optical semiconductor element and the top face of the V-groove on a same plane. That is, the optical fiber is attached to the V-groove of the V-groove substrate in a step after the optical semiconductor element is mounted on the V-groove substrate (see paragraph 0052 of Patent Document 2), so that the relative positional relation of the height of the active layer of the optical semiconductor element and the height of the optical fiber on the V-groove substrate cannot be guaranteed unless the optical fiber is attached properly to the V-groove substrate.

Therefore, in the optical module disclosed in Patent Document 2, there still remains such an inconvenience that the height of the active layer of the optical semiconductor element and the height of the optical fiber on the V-groove substrate may not be aligned with each other. Patent Document 3 discloses a point that an optical semiconductor element is mounted in a junction-up state on a mount face formed by etching a substrate that forms a waveguide. However, the technical significance of mounting the optical semiconductor element in a junction-up state is not specifically disclosed therein.

It is therefore an exemplary object of the present invention to provide a laser module manufacturing method which can improve the SMSR property by stabilizing the oscillation of the laser and can precisely align the height of the active layer of the optical semiconductor element with the height of the waveguide of the planar lightwave circuit in the normal direction of the waveguide forming face, and to provide a laser module.

SUMMARY OF THE INVENTION

The laser module manufacturing method according to an exemplary aspect of the invention is a manufacturing method of a laser module in which an optical semiconductor element constituting a part of the laser module is mounted, via a solder layer, on a mount face that is formed on a planar lightwave circuit by notching a part of the planar lightwave circuit constituting another part of the laser module from a surface on a waveguide forming face side of the planar lightwave circuit towards a normal direction thereof so as to align height of an active layer of the optical semiconductor element and height of a waveguide of the planar lightwave circuit in the normal direction of a waveguide forming face. In order to achieve the foregoing exemplary object, the method is particularly characterized to include: forming the mount face by notching the planar lightwave circuit along depth of a value acquired by adding a reference thickness of the optical semiconductor element on design from the surface on a waveguide forming face side of the planar lightwave circuit where the waveguide is formed, a reference value of the solder layer on design, and a difference between a reference value of a distance on design from the surface on the waveguide forming face side of the planar lightwave circuit to the center of the waveguide of the planar lightwave circuit and a reference value of a distance on design from the top face of the optical semiconductor element to the center of the active layer of the optical semiconductor element; holding the optical semiconductor element in a junction-up state at an approach start position isolated from the mount face, and bringing down the optical semiconductor element closer to the mount face to height where top-face height of the optical semiconductor element is aligned with height of the surface on the waveguide forming face side of the planar lightwave circuit; and crushing the solder layer between the mount face and the optical semiconductor element by bringing the optical semiconductor element towards the mount face for an amount of the difference between the reference value of the distance on design from the surface on the waveguide forming face side of the planar lightwave circuit to the center of the waveguide of the planar lightwave circuit and the reference value of the distance on design from the top face of the optical semiconductor element to the center of the active layer of the optical semiconductor element to mount the optical semiconductor element on the planar lightwave circuit.

The laser module according to another exemplary aspect of the invention is a laser module including an optical semiconductor element constituting a part of the laser module mounted via a solder layer on a mount face that is formed on a planar lightwave circuit by notching a part of the planar lightwave circuit constituting other part of the laser module from a surface on a waveguide forming face side of the planar lightwave circuit towards a normal direction thereof. In order to achieve the foregoing exemplary object, the laser module is particularly characterized in that: the mount face is formed by notching the planar lightwave circuit along depth of a value acquired by adding a reference thickness of the optical semiconductor element on design from the surface on the waveguide forming face side of the planar lightwave circuit where the waveguide is formed, a reference thickness of the solder layer on design, and a difference between a reference value of a distance on design from the surface on the waveguide forming face side of the planar lightwave circuit to the center of the waveguide of the planar lightwave circuit and a reference value of a distance on design from the top face of the optical semiconductor element to the center of the active layer of the optical semiconductor element; and on the mount face, the optical semiconductor element is mounted in a junction-up state via the solder layer with thickness under a crushed state equivalent to the reference thickness on design in such a manner that top-face height of the optical semiconductor element is lower than the height of the surface on the waveguide forming face side of the planar lightwave circuit for an amount of the difference between the reference value of the distance on design from the surface on the waveguide forming face side of the planar lightwave circuit to the center of the waveguide of the planar lightwave circuit and the reference value of the distance on design from the top face of the optical semiconductor element to the center of the active layer of the optical semiconductor element.

DETAILED DESCRIPTION OF THE PREFERRED EMBODIMENTS

Next, modes for embodying the present invention will be described in a specific manner by referring to the accompanying drawings.

Figure 1:
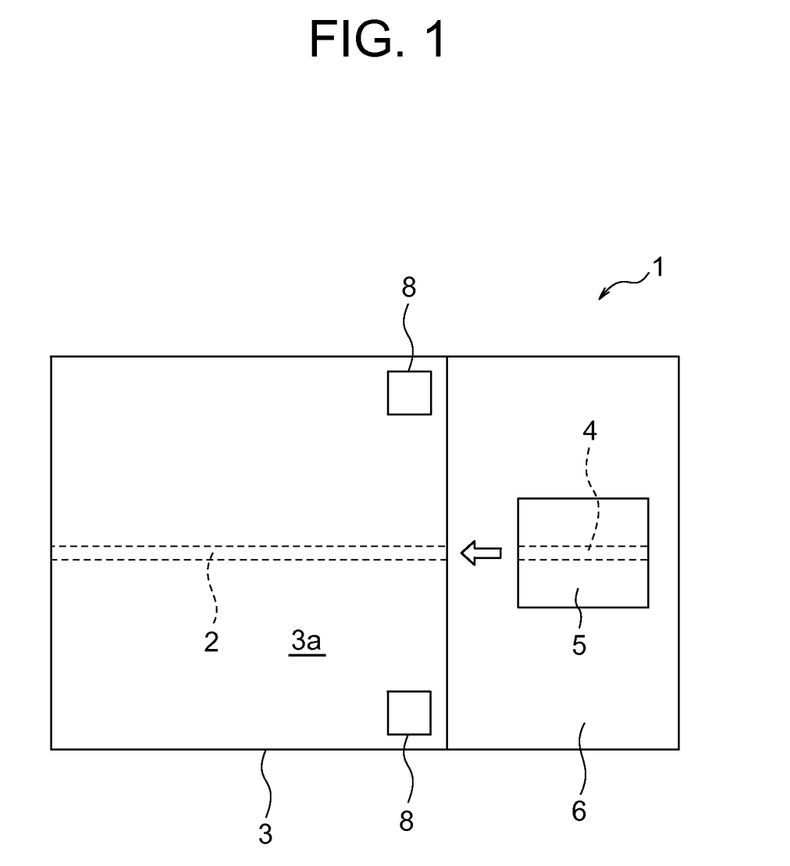
FIG. 1 is a plan view showing, in a simplified manner, the structure of a laser module according to an exemplary embodiment manufactured by employing a laser module manufacturing method according to the present invention.
Figure 2:
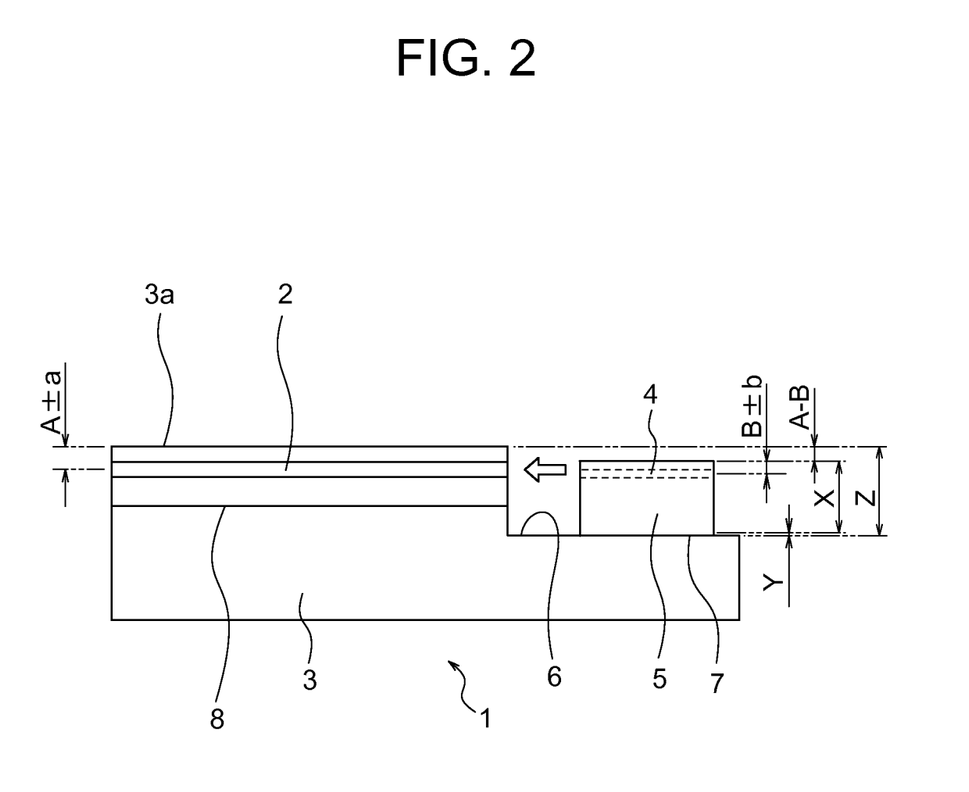
FIG. 2 is a side sectional view showing the structure of the laser module according to the exemplary embodiment in a simplified manner.
Figure 3:
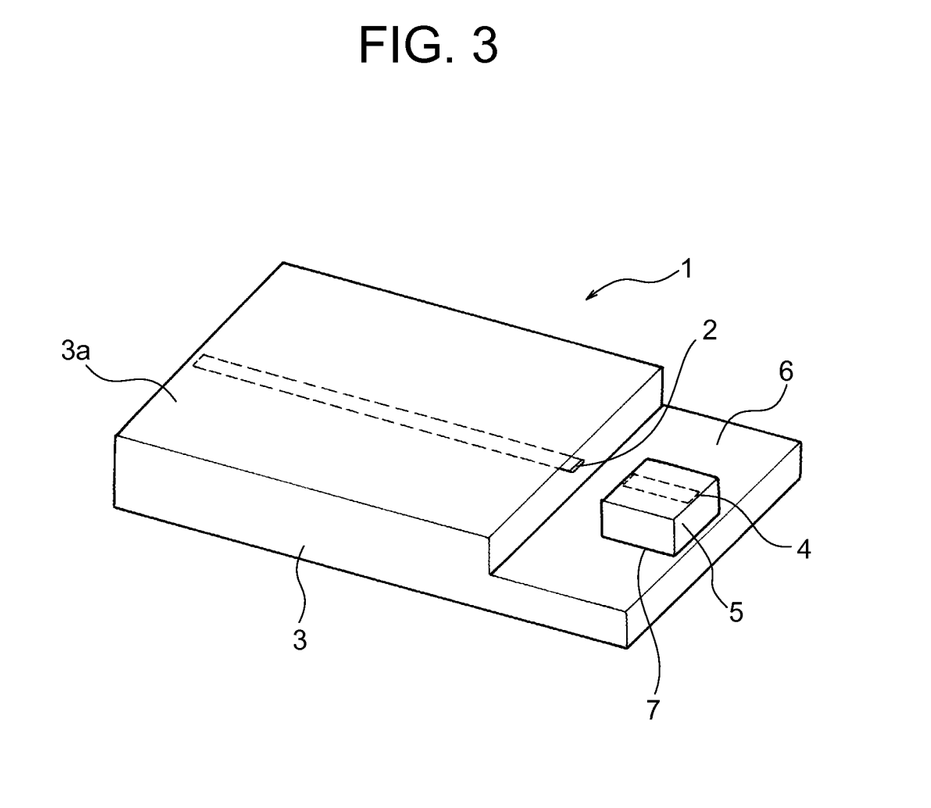
FIG. 3 is a perspective view showing the structure of the laser module according to the exemplary embodiment in a simplified manner.

FIG. 1 is a plan view showing, in a simplified manner, the structure of a laser module 1 according to an exemplary embodiment manufactured by employing a laser module manufacturing method according to the present invention. FIG. 2 is a side sectional view showing the structure of the laser module 1 according to the exemplary embodiment in a simplified manner. Further, FIG. 3 is a perspective view showing the structure of the laser module 1 according to the exemplary embodiment in a simplified manner.

The laser module 1 according to the exemplary embodiment is constituted with a planar lightwave circuit (PLC) 3 on which a waveguide 2 is formed, and an optical semiconductor element (laser chip) 5 that includes an active layer 4.

As shown in FIG. 2, a flat notch is provided in a part of the planar lightwave circuit 3 from a surface 3a on a waveguide forming face side of the planar lightwave circuit 3 towards its normal direction, i.e., towards a direction from the upper side to the lower side of FIG. 2, to form a mount face 6 for mounting an optical semiconductor element 5. Further, the optical semiconductor element 5 is mounted on the mount face 6 in a junction-up state via a solder layer 7.

As shown in FIG. 2, depth "Z" of the notch with respect to the surface 3a on the waveguide forming face of the planar lightwave circuit 3 is defined as the depth acquired by adding reference thickness "X" of the optical semiconductor element 5 on design, reference thickness "Y" of the solder layer 7 on design, and a difference (A−B, where A>B) between a reference value "A" of the distance on design from the surface 3a on the waveguide forming face side of the planar lightwave circuit 3 to the center of the waveguide 2 of the planar lightwave circuit 3 and a reference value "B" of the distance on design from the top face of the optical semiconductor element 5 to the center of the active layer 4 of the optical semiconductor element 5.

Therefore, even if the optical semiconductor element 5 is mounted on the mount face 6 of the planar lightwave circuit 3 via the solder layer 7 in a state where the top face of the optical semiconductor element 5 having the thickness that is the thickest within a range of tolerance on design becomes lower than the surface 3a on the waveguide forming face side by the distance corresponding to the difference "(A−B)" between the reference value "A" of the distance on design from the surface 3a on the waveguide forming face side of the planar lightwave circuit 3 to the center of the waveguide 2 of the planar lightwave circuit 3 and the reference value "B" of the distance on design from the top face of the optical semiconductor element 5 to the center of the active layer 4 of the optical semiconductor element 5, simply the thickness of the solder layer 7 crushed between the mount face 6 and the optical semiconductor element 5 becomes slightly thinner than the reference thickness "Y". Thus, sufficient thickness is guaranteed for the solder 7 to fix the optical semiconductor element 5 to the mount face 6.

Inversely, even if the optical semiconductor element 5 has the thickness that is the thinnest within the range of tolerance on design, simply the thickness of the solder layer 7 crushed between the mount face 6 and the optical semiconductor element 5 becomes slightly thicker than the reference thickness "Y" and the crushed amount becomes slightly decreased. This reduction in the crushed amount has no significance when fixing the optical semiconductor element on the mount face 6.

In any cases, the thickness of the crushed solder layer 7 is simply increased or decreased with respect to the reference thickness "Y" on design, and the thickness is substantially equivalent to the reference thickness "Y" on design.

Fat arrows in FIG. 1 and FIG. 2 show the traveling direction of the laser beam radiated from the active layer 4 of the optical semiconductor element 5.

Further, reference metal marks 8, 8 shown in FIG. 1 are marks used when positioning the active layer 4 of the optical semiconductor element 5 in the horizontal direction with respect to the waveguide 2 of the planar lightwave circuit 3. Positioning within a horizontal plane is already known as depicted in Patent Document 1, Patent Document 2, and the like, so that it is not specifically described herein.

Next, the laser module manufacturing method according to the exemplary embodiment will be described in a specific manner by referring to FIG. 4 to FIG. 6.

Note, however, that the waveguide 2 of the planar lightwave circuit 3 and the active layer 4 of the optical semiconductor element 5 are already being formed at the stage of manufacturing the planar lightwave circuit 3 and the optical semiconductor element 5.

As shown in FIG. 2, it is so defined herein that the reference value "A" is the distance on design from the surface 3a on the waveguide forming face side of the planar lightwave circuit 3 to the center of the waveguide 2 of the planar lightwave circuit 3 and the reference value "B" is the distance on design from the top face of the optical semiconductor element 5 to the center of the active layer 4 of the optical semiconductor element 5.

However, there is variation of some extent in the distance "A" from the surface 3a on the waveguide forming face side of the planar lightwave circuit 3 to the center of the waveguide 2 of the planar lightwave circuit 3 depending on the lot of the planar lightwave circuit 3. As shown in FIG. 2, an upper-limit tolerance for tolerating the margin of error thereof is defined as "+a" and a lower-limit tolerance is defined as "−a" herein. Similarly, an upper-limit tolerance of the distance from the top face of the optical semiconductor element 5 to the center of the active layer 4 of the optical semiconductor element 5 is defined as "+b" and a lower-limit tolerance thereof is defined as "−b".

That is, in all the planar lightwave circuits 3 manufactured properly, the actual values of the distance from the surface 3a to the center of the waveguide 2 are within "A±a". Further, in all the optical semiconductor elements 5 manufactured properly, the actual values of the distance from the top face of the optical semiconductor element 5 to the center of the active layer 4 are within "B±b". Note that "a" and "b" are both positive values.

As has already been described, the depth "Z" of the notch with respect to the surface 3a on the waveguide forming face side of the planar lightwave circuit 3 is defined as the depth acquired by adding the reference thickness "X" of the optical semiconductor element 5 on design, the reference thickness "Y" of the solder layer 7 on design, and the difference "(A−B)" between the reference value "A" of the distance on design from the surface 3a on the waveguide forming face side of the planar lightwave circuit 3 to the center of the waveguide 2 of the planar lightwave circuit 3 and the reference value "B" of the distance on design from the top face of the optical semiconductor element 5 to the center of the active layer 4 of the optical semiconductor element 5. This notch is formed on the planar lightwave circuit 3 by using known etching processing or the like.

Figure 4:
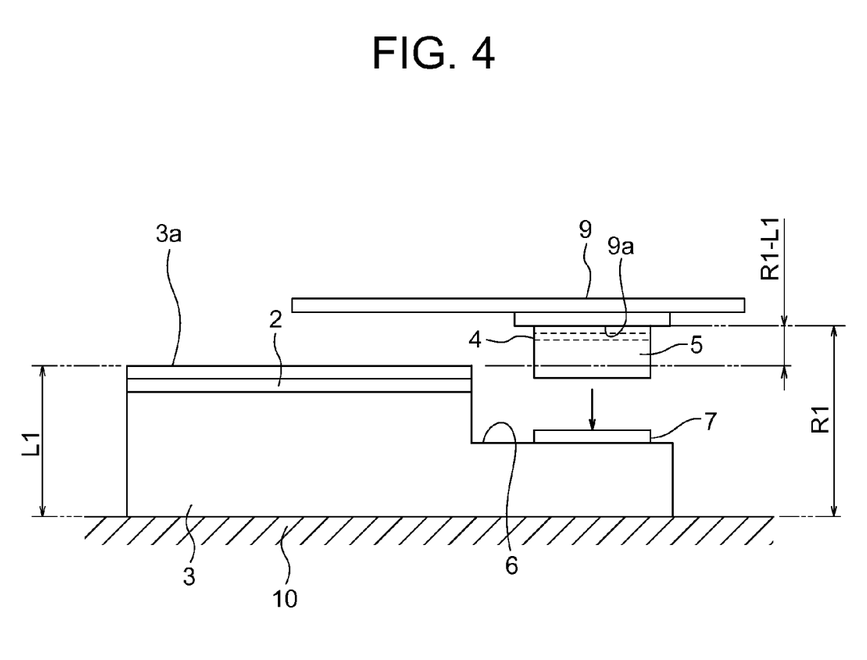
FIG. 4 is an action principle chart showing a state of holding an optical semiconductor element in a junction-up state at an approach start position isolated towards an upper side from a mount face by driving an arm of a mount device that handles the optical semiconductor element.

Then, as shown in FIG. 4, the planar lightwave circuit 3 is placed on a table 10 of a mounting device that is used when mounting the optical semiconductor element 5 to the planar lightwave circuit 3, the solder layer 7 is formed by applying a solder on the mount face 6 of the planar lightwave circuit 3 by a known dispenser or the like and then by melting it, and an arm 9 having an absorption module such as a vacuum drawer of the mounting device that handles the optical semiconductor element 5 is driven to hold the optical semiconductor element 5 at a semiconductor holding face 9a provided on the bottom-face side of the arm 9 at an approach start position isolated from the mount face 6 towards the upper side in a junction-up state, i.e., to hold it in a state where the active layer 4 is located on the upper side.

There are various kinds of already-known mounting devices that are used when mounting the optical semiconductor element 5 to the planar lightwave circuit 3.

The mounting device employed in this exemplary embodiment is a mounting device that is drive-controlled by a numerical-value control device (not shown). In particular, the mounting device includes a Z-axis current-position storing register which successively updates and stores the current position of the arm 9 by having the top face of the table 10 as the machine origin, i.e., the height of the semiconductor holding face 9a of the arm 9 that holds the optical semiconductor element 5, and includes a laser distance measuring device (not shown) which measures a vertical isolated distance from the top face of the table 10 as the machine origin to the surface 3a on the waveguide forming face side of the planar lightwave circuit 3.

Then, the numerical-value control device reads current value "R1" (that is, top-face height "R1" of the optical semiconductor element 5 with respect to the top face of the table 10) of the Z-axis current position storing register in a state where the arm 9 is being stopped as shown in FIG. 4 while keeping the optical semiconductor element 5 held by the semiconductor holding face 9a of the arm 9 at the approach start position isolated from the mount face 6 towards the upper side, and drives the laser distance measuring device to measure height "L1" of the surface 3a of the planar lightwave circuit 3 with respect to the top face of the table 10 so as to first acquire a difference "(R1−L1)" between the top-face height "R1" of the optical semiconductor element 5 and the top-face height "L1" of the planar lightwave circuit 3.

Figure 5:
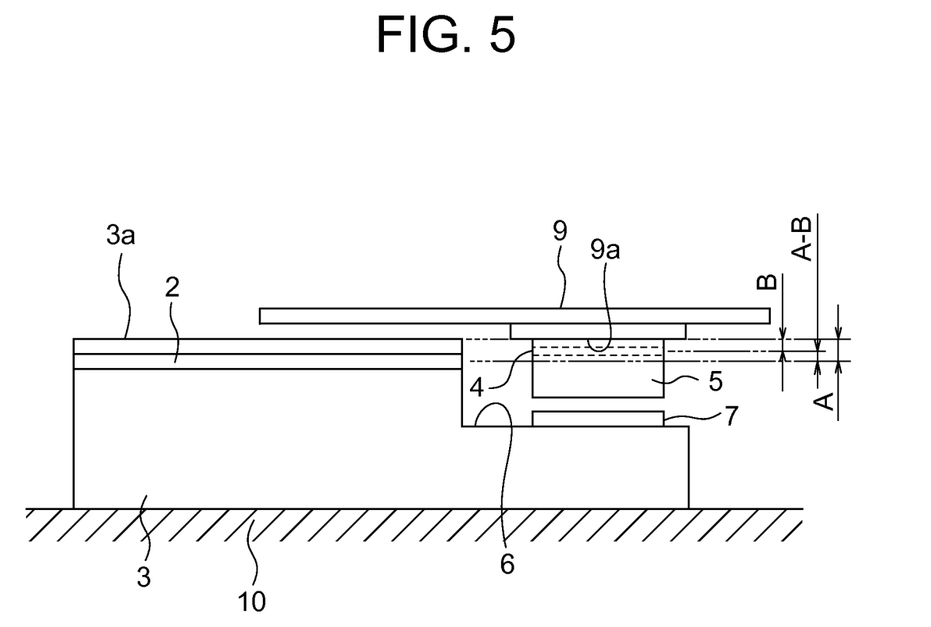
FIG. 5 is an action principle chart showing a state where the arm of the mount device that handles the optical semiconductor element is brought down so that the height of the top face of the optical semiconductor element is aligned with the height of the top face of the planar lightwave circuit.
Figure 6:
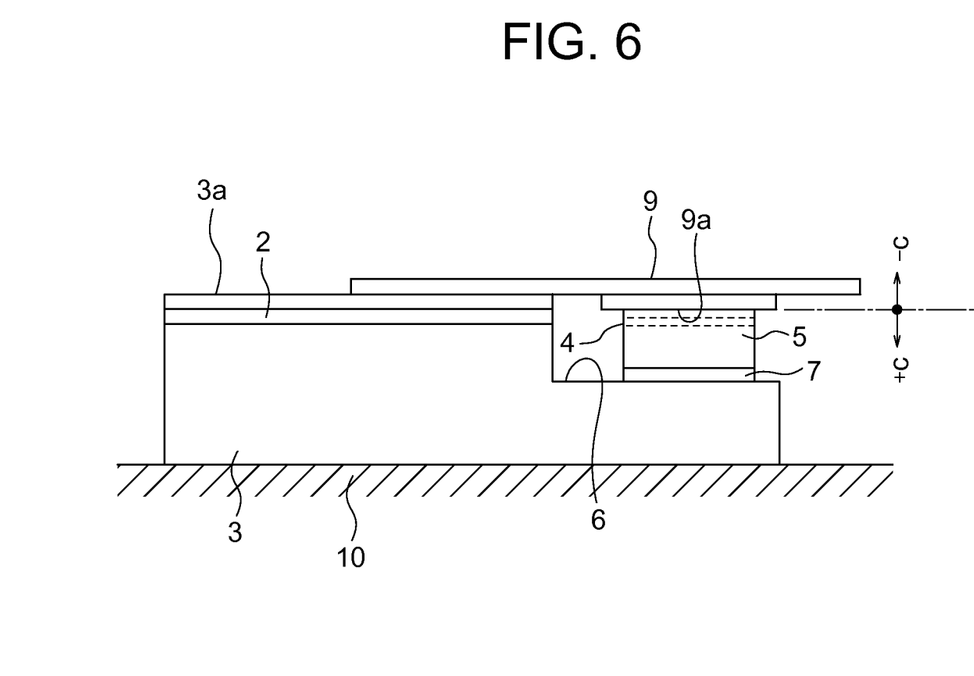
FIG. 6 is an action principle chart showing a state where the arm of the mount device that handles the optical semiconductor element is brought down completely so that the top face of the optical semiconductor element is lower than the top face of the planar lightwave circuit for a distance corresponding to a difference "A–B".

Assuming that the drive control of the arm 9 is started from the state of FIG. 4 by taking the difference "(R1−L1)" as an incremental moving instruction "S" for a lift-down action of the arm 9, the arm 9 is brought down to the position shown in FIG. 5, i.e., the position where the height of the top face of the optical semiconductor element 5 is aligned with the height of the surface 3a of the planar lightwave circuit 3, from the approach start position shown in FIG. 4 by this moving instruction "(R1−L1)".

However, actually, in the state where the height of the top face of the optical semiconductor element 5 is aligned with the height of the surface 3a of the planar lightwave circuit 3, the center position of the active layer 4 of the optical semiconductor element 5 theoretically comes to be located at the position higher than the center position of the waveguide 2 of the planar lightwave circuit 3 for the amount of the difference "(A−B)" as shown in FIG. 5 since the reference value of the distance on design from the surface 3a on the waveguide forming face side of the planar lightwave circuit 3 to the center of the waveguide 2 of the planar lightwave circuit 3 is "A" and the reference value of the distance on design from the top face of the optical semiconductor element 5 that is at the same height as that of the surface 3a on the waveguide forming face side of the planar lightwave circuit 3 to the center of the active layer 4 of the optical semiconductor element 5 is "B".

Therefore, the value of the incremental moving amount for the lift-down action required for the arm 9 to align the center of the active layer 4 of the optical semiconductor 5 with the center of the waveguide 2 of the planar lightwave circuit 3 in the height direction, i.e., along the normal direction of the surface 3a on the waveguide forming face side of the planar lightwave circuit 3, actually becomes "(R1−L1)+(A−B)" by considering the difference "(A−B)" by having the approach start position shown in FIG. 4 as the origin.

Therefore, the numerical-value control device actually drives the arm 9 to hold the optical semiconductor element 5 at the approach start position isolated from the mount face 6 towards the upper side, reads the current value "R1" of the Z-axis current position storing register at the point of FIG. 4 where the arm 9 is stopped, and drives the laser distance measuring device to measure the height "L1" of the surface 3a of the planar lightwave circuit 3 with respect to the top face of the table 10. Further, the numerical-value control device acquires the value of the incremental moving instruction "S" for the lift-down action of the arm 9 required for aligning the center of the active layer 4 of the optical semiconductor element 5 with the center of the waveguide 2 of the planar lightwave circuit 3, i.e., the value of "S=(R1−L1)+(A−B)" based on the reference value "A" of the distance on design from the surface 3a on the waveguide forming face of the planar lightwave circuit 3 to the center of the waveguide 2 of the planar lightwave circuit 3 and the reference value "B" of the distance on design from the top face of the optical semiconductor element 5 to the center of the active layer 4 of the optical semiconductor element 5 or based on the difference value "(A−B)" stored in advance in a memory instead of those values "A" and "B", and starts the lift-down action of the arm 9 from the approach start position shown in FIG. 4 by taking the value of "S=(R1−L1)+(A−B)" as the incremental instruction "S" to bring the optical semiconductor element 5 held at the semiconductor holding face 9a of the arm 9 closer to the mount face 6 of the planar lightwave circuit 3.

When the moving instruction corresponding to the moving distance "(R1−L1)" of the moving instruction of "S=(R1−L1)+(A−B)" is executed, the optical semiconductor element 5 is brought closer to the mount face 6 up to the position where the height of the top face of the optical semiconductor element 5 is aligned with the height of the surface 3a of the planar lightwave circuit 3 as has already been described by referring to FIG. 5.

Furthermore, when the moving instruction corresponding to the moving distance of "(A−B)" as the remainder of the moving instruction "S" is executed, the arm 9 is brought down further from the state of FIG. 5 where the height of the top face of the optical semiconductor element 5 is aligned with the height of the surface 3a of the waveguide forming face side of the planar lightwave circuit 3 to the descending direction for the distance corresponding to the difference "(A−B)" between the reference value "A" of the distance on design from the surface 3a on the waveguide forming face side of the planar lightwave circuit 3 to the center of the waveguide 2 of the planar lightwave circuit 3 and the reference value "B" of the distance on design from the top face of the optical semiconductor element 5 to the center of the active layer 4 of the optical semiconductor element 5. Thus, the solder layer 7 is crushed between the mount face 6 and the optical semiconductor element 5 in accordance with the lift-down of the optical semiconductor element 5 that is held at the semiconductor holding face 9a of the arm 9. At last, as shown in FIG. 6 and FIG. 2, the optical semiconductor element 5 is mounted on the mount face 6 of the planar lightwave circuit 3 via the solder layer 7 in a state where the top face of the optical semiconductor element 5 is lower than the surface 3a of the waveguide forming face side for the distance corresponding to the difference value "(A−B)".

However, actually, a margin of error in manufacture is allowed within a range of "±a" for the reference value "A" as the actual value of the distance from the surface 3a of the planar lightwave circuit 3 to the center of the waveguide 2 and a margin of error in manufacture is allowed within a range of "±b" for the reference value "B" as the actual value of the distance from the top face of the optical semiconductor element 5 to the center of the active layer 4. Thus, the values of "A" and "B" used for arithmetic operations for the numerical-value control are not necessarily consistent with the actual distance from the surface 3a of the planar lightwave circuit 3 to the center of the waveguide 2 and the actual distance from the top face of the optical semiconductor element 5 to the center of the active layer 4.

Further, the difference "A−B" is the value based on the reference values "A" and "B" on design, so that there is no concept of having a margin of error in itself. However, there is a specific margin of error in the current position detection accuracy of the arm 9 in the mounting device and the measurement accuracy of the laser distance measuring device. Thus, the values of the current value "R1" of the Z-axis current position storing register and the top-face height "L1" of the planar lightwave circuit 3 detected by the laser distance measuring device are not necessarily the true values.

Furthermore, there is also a margin of error generated in the power source and power transmission system of the mounting device used when moving the arm 9 vertically based on the moving instruction "S", e.g., under travel or over travel caused due to a backlash, friction resistance, inertia, or the like. Thus, even if the moving instruction of "S=(R1−L1)+(A−B)" is executed properly by the numerical-value control device, there is no guarantee that the arm 9 is essentially brought down for the distance of "S=(R1−L1)+(A−B)".

Here, it is assumed that the positioning accuracy of the arm 9 with respect to the target position is guaranteed within tolerance of "±c" by combining a margin of error in the current position detection accuracy of the arm 9, a margin of error in the measurement of the laser distance measuring device, and a margin of error when driving the arm 9. Note that "c" is a positive value.

Therefore, the lift-down amount of the arm 9 moved based on the above-described moving instruction of "S=(R1−L1)+(A−B)" is actually in a range of a following expression.

(True value of $R1$−True value of $L1$)+$(A-B)$+$(\pm c)$  (Expression 1)

However, as has already been described, the third term "±c" in the third term of Expression 1 is tolerance of a combination of the detection error of "R1", the measurement error of "L1", and the positioning error caused due to the under travel or over travel of the arm 9, so that "true value of R1" and "true value of L1" in the first term do not include a margin of error.

In the meantime, the range where the actual values of the distance from the surface 3a of the planar lightwave circuit 3 to the center of the waveguide 2 are guaranteed is "A±a", and the range where the actual values of the distance from the top face of the optical semiconductor element 5 to the center of the active layer 4 are guaranteed is "B±b". Thus, there is a margin of error generated between the reference value "A" of Expression 1 and the actual value "A±a" by "±a" at the maximum. Similarly, there is a margin of error generated between the reference value "B" of Expression 1 and the actual value "B±b" by "±b" at the maximum. Therefore, considering all of the maximum margin of error "±c" of the positioning accuracy of the arm 9, the maximum margin of error "±a" between the reference value "A" and the actual value "A±a", and the maximum margin of error "±b" between the reference value "B" and the actual value "B±b", the margin of error in the vertical direction generated between the center of the active layer 4 of the optical semiconductor element 5 and the center of the waveguide 2 of the planar lightwave circuit 3, i.e., the margin of error generated along the normal direction of the surface 3a on the waveguide forming face side of the planar lightwave circuit 3, is perfectly guaranteed within a range of integrated value of the absolute value "a" of the tolerance on design regarding the distance from the surface 3a on the waveguide forming face side of the planar lightwave circuit board 3 to the center of the waveguide 2 of the planar lightwave circuit 3, the absolute value "b" of the tolerance on design regarding the distance from the top face of the optical semiconductor element 5 to the center of the active layer 4, and the absolute value "c" of the tolerance of the positioning accuracy of the arm 9 in the mounting device that handles the optical semiconductor element 5, i.e., within a range of "±(a+b+c)", at the maximum.

In short, the margin of error in the vertical direction generated between the center of the active layer 4 of the optical semiconductor element 5 and the center of the waveguide 2 of the planar lightwave circuit 3 becomes the maximum only in a case where the actual value of the distance from the surface 3a of the planar lightwave circuit 3 to the center of the waveguide 2 is "(A+a)", the actual value of the distance from the top face of the optical semiconductor element 5 to the center of the active layer 4 is "(B−b)", and also there is a margin of error "+(a+b+c)" generated due to an over travel "+c" generated in the lift-down action of the arm 9 because the combination of the margin of error in the current position detection accuracy of the arm 9, the margin of error in the measurement accuracy of the laser distance measuring device, and the margin of error at the time of driving the arm 9 becomes the maximum, and inversely, only in a case where the actual value of the distance from the surface 3a of the planar lightwave circuit 3 to the center of the waveguide 2 is "(A−a)", the actual value of the distance from the top face of the optical semiconductor element 5 to the center of the active layer 4 is "(B+b)", and also there is a margin of error "−(a+b+c)" generated due to an under travel "−c" generated in the lift-down action of the arm 9 because the combination of the margin of error in the current position detection accuracy of the arm 9, the margin of error in the measurement accuracy of the laser distance measuring device, and the margin of error at the time of driving the arm 9 becomes the maximum.

Since "a" is the value specified by the manufacture accuracy of the planar lightwave circuit 3, "b" is the value specified by the manufacture accuracy of the optical semiconductor element 5, and "c" is the value specified by the performance of the mounting device, it is theoretically a limit to suppress the amount of position shift in the vertical direction generated between the active layer 4 of the optical semiconductor element 5 and the waveguide 2 of the planar lightwave circuit 3 within a range of "±(a+b+c)".

In this exemplary embodiment, in particular, the lift-down amount of the arm 9 from the approach start position, i.e., the lift-down amount of the optical semiconductor element 5, is calculated based on the points that can be accurate in manufacturing the planar lightwave circuit 3 and in manufacturing the optical semiconductor element 5 with respect to the surface 3a on the waveguide forming face of the planar lightwave circuit 3 and the top face of the optical semiconductor element 5, i.e., the reference value "A" of the distance from the surface 3a of the planar lightwave circuit 3 to the center of the waveguide 2 and the reference value "B" of the distance from the top face of the optical semiconductor element 5 to the center of the active layer 4. Thus, it is possible to overcome influences of variation in the entire thickness of the planar lightwave circuit boar 3 and variation in the entire thickness of the optical semiconductor element 5 imposed upon the positioning accuracy of the active layer 4 and the waveguide 2 in the vertical direction.

This makes it possible to execute a mounting work with higher accuracy compared to a known mounting method which aligns the height of the active layer 4 and the height of the waveguide 2 in the vertical direction by mounting the optical semiconductor element 5 in a junction-up state by having the mount face 6 as the reference face for adjusting the height of the active layer 4, i.e., a known mounting method with which variation in the entire thickness of the planar lightwave circuit 3, the entire thickness of the optical semiconductor element 5, and variation in the depth of the notch for forming the mount face influence the accuracy.

When there is variation in the entire thickness of the optical semiconductor element 5, a slight fluctuation is generated as a result in the vertical isolated distance between the bottom face of the optical semiconductor element 5 and the mount face 6. However, the solder layer 7 is interposed therebetween, and the solder layer 7 is crushed as has already been described. Thereby, the fluctuation in the isolated distance is absorbed. Thus, the optical semiconductor element 5 can be properly fixed to the mount face 6.

Moreover, the active layer 4 of the optical semiconductor element 5 is isolated from the mount face 6 of the planar lightwave circuit 3 for the amount of the thickness of the optical semiconductor element 5. Thus, it is possible to overcome such an inconvenience that the stress of the solder layer 7 directly works on the active layer 4 of the optical semiconductor element 5 and to improve the SMSR property of the laser.

AuSn, AuSi, AuSb, BiSn, SnPb, and the like can be used as the solder layer 7.

As an exemplary advantage according to the invention, the laser module manufacturing method and the laser module according to the present invention are designed to: form the mount face by notching the planar lightwave circuit along depth of a value acquired by adding a reference thickness of the optical semiconductor element on design from the surface on a waveguide forming face side of the planar lightwave circuit where the waveguide is formed, a reference value of the solder layer on design, and a difference between a reference value of a distance on design from the surface on the waveguide forming face side of the planar lightwave circuit to the center of the waveguide of the planar lightwave circuit and a reference value of a distance on design from the top face of the optical semiconductor element to the center of the active layer of the optical semiconductor element; hold the optical semiconductor element in a junction-up state at an approach start position isolated from the mount face, and bring down the optical semiconductor element closer to the mount face to height where top-face height of the optical semiconductor element is aligned with height of the surface on the waveguide forming face side of the planar lightwave circuit; and crush the solder layer between the mount face and the optical semiconductor element by bringing the optical semiconductor element towards the mount face for an amount of the difference between the reference value of the distance on design from the surface on the waveguide forming face side of the planar lightwave circuit to the center of the waveguide of the planar lightwave circuit and the reference value of the distance on design from the top face of the optical semiconductor element to the center of the active layer of the optical semiconductor element to mount the optical semiconductor element on the planar lightwave circuit. Thus, even when there is variation in the depth of the mount face formed by notching or in the thickness of the optical semiconductor element, the height of the active layer of the optical semiconductor element and the height of the waveguide of the planar lightwave circuit can be aligned precisely within a range of the integration value of an absolute value of tolerance of the distance on design from the surface on the waveguide forming face side of the planar lightwave circuit to the center of the planar lightwave circuit, an absolute value of tolerance of the distance on design from the top face of the optical semiconductor element to the center of the active layer of the optical semiconductor element, and an absolute value of tolerance of the positioning accuracy of the mounting device that handles the optical semiconductor element. Moreover, the active layer of the optical semiconductor element is isolated from the mount face of the planar lightwave circuit by the amount corresponding to the thickness of the optical semiconductor element in a state where the optical semiconductor element is being mounted on the planar lightwave circuit. Thus, it is possible to overcome such an inconvenience that the stress of the solder layer directly works on the active layer of the optical semiconductor element and to improve the SMSR property by stabilizing the oscillation of the laser.

In the above, as an exemplary embodiment, described is the embodiment which: acquires the top-face height "R1" of the optical semiconductor element 5 with respect to the top face of the table 10 from the Z-axis current position storing register and measures the height "L1" of the surface 3*a* of the planar lightwave circuit 3 with respect to the top face of the table 10 by a laser distance measuring device in a state where the optical semiconductor element 5 is held at the semiconductor holding face 9*a* of the arm 9 at the approach start position isolated from the mount face 6 of the planar lightwave circuit 3 towards the upper side; acquires the value of the incremental moving instruction "S" required for the lift-down action of the arm 9 based on the difference "(R1−L1)" between the top-face height "R1" and the top-face height "L1" and the reference values "A", "B" stored in advance as parameters in a memory of the numerical-value control device; and continuously lifts down the arm 9 to the final target position, i.e., to the position lower from the approach start position for the distance of "(R1−L1)+(A−B)" according to an output of the moving instruction from the numerical-value control device to the mounting device. However, it is also possible to employ a structure which: uses a contact-type sensor instead of the laser distance measuring device, detects by the contact-type sensor that the height of the surface 3*a* of the planar lightwave circuit 3 and the height of the semiconductor holding face 9*a*, i.e., the height of the optical semiconductor element 5, are aligned; and moves the semiconductor holding face 9*a* further from that position to the lower side for the distance of "(A−B)".

For example, the structure shown in FIG. 4 is modified as follows. That is, a piezoelectric element or the like is placed between the semiconductor holding face 9*a* and the bottom face of the arm 9 as a slight feeding actuator, and the piezoelectric element functioning as the slight feeding actuator and the arm 9 are made movable vertically in a unified manner by moving the arm 9 up and down by a lifting mechanism constituted with a servo motor, a ball nut & screw, or the like. Further, a contact-type sensor having a projection amount from the bottom face of the arm 9 equivalent to the projection amount of the semiconductor holding face 9*a* when the piezoelectric element functioning as the slight feeding actuator is degenerated completely is provided to the bottom face of the arm 9 that is located on the upper side of the surface 3*a* of the planar lightwave circuit 3.

In a case where such structure is employed, first, as shown in FIG. 4, the projection amount of the semiconductor holding face 9*a* from the bottom face of the arm 9 and the projection amount of the contact-type sensor from the bottom face of the arm 9 are set to be the same by completely degenerating the piezoelectric element functioning as the slight feeding actuator in a state where the optical semiconductor element 5 is held to the semiconductor holding face 9*a* of the arm 9 at the approach start position isolated from the mount face 6 towards the upper side, the servo motor is driven at a low torque and a low speed by pulse distribution processing of the numerical-value control device to lift down the arm 9 at a low speed without designating the target position, and the servo motor is immediately stopped at the point where the contact-type sensor detects the surface 3a of the planar lightwave circuit 3 to keep the current position of the arm 9.

At this point, the projection amount of the contact-type sensor with respect to the bottom face of the arm 9 and the projection amount of the semiconductor holding face 9a are the same. Thus, at the point where the drive of the servo motor is stopped in the manner described above, the height of the semiconductor holding face 9a, i.e., the height of the top face of the optical semiconductor element 5, is aligned with the height of the planar lightwave circuit 3, and the relative relation between the height of the surface 3a of the planar lightwave circuit 3 and the height of the top face of the optical semiconductor element 5 are in a state completely same as that of FIG. 5.

Then, the lift-down distance "(A–B)" of the arm 9 is acquired based on the reference value "A" and the reference value "B" stored in advance in the memory of the numerical-value control device as the parameters, the piezoelectric element functioning as the slight feeding actuator is drive-controlled to project towards the lower side from the complete degenerated state for the distance of "(A–B)", and only the semiconductor holding face 9a is moved to the lower side while keeping the current position of the arm 9.

The result in this case is also the same as the case described above. At last, as shown in FIG. 6 and FIG. 2, the optical semiconductor element 5 is mounted on the mount face 6 of the planar lightwave circuit 3 via the solder layer 7 in a state where the top face of the optical semiconductor element 5 is lower than the surface 3a on the waveguide forming face side for the distance corresponding to the difference "(A–B)".

Further, it is also possible to omit the contact-type sensor, and to provide a stopper which has the projection amount equivalent to the projection amount of the semiconductor holding face 9a in a state where piezoelectric element functioning as the slight feeding actuator is completely degenerated at the bottom face of the arm 9 that is located on the upper side of the surface 3a of the planar lightwave circuit 3.

In that case, the numerical-value control device side detects an increase of the drive current of the servo motor by monitoring a current loop of the servo motor, recognizes the increase of the drive current, i.e., the effect of the reaction torque, as the contact between the stopper and the surface 3a of the planar lightwave circuit 3, and stops the drive of the servo motor.

While the present invention has been described above by referring to each of the exemplary embodiments, the present invention is not limited only to each of those exemplary embodiments.

Various changes and modifications occurred to those skilled in the art can be applied to the structures and details of the present invention.

The whole or part of the exemplary embodiments disclosed above can be described as, but not limited to, the following supplementary notes.

(Supplementary Note 1)

A manufacturing method of a laser module (1) in which an optical semiconductor element (5) constituting a part of the laser module (1) is mounted, via a solder layer 7, on a mount face (6) that is formed on a planar lightwave circuit (3) by notching a part of the planar lightwave circuit (3) constituting another part of the laser module (1) from a surface (3a) on a waveguide forming face side of the planar lightwave circuit (3) towards a normal direction thereof so as to align height of an active layer (4) of the optical semiconductor element (5) and height of a waveguide (2) of the planar lightwave circuit (3) in the normal direction of a waveguide forming face, and the method includes: forming the mount face (6) by notching the planar lightwave circuit (3) along depth of a value acquired by adding a reference thickness "X" of the optical semiconductor element (5) on design from the surface (3a) on the waveguide forming face side of the planar lightwave circuit (3) where the waveguide (2) is formed, a reference thickness "Y" of the solder layer (7) on design, and a difference "(A–B)" between a reference value "A" of a distance on design from the surface (3a) on the waveguide forming face side of the planar lightwave circuit (3) to the center of the waveguide (2) of the planar lightwave circuit (3) and a reference value "B" of a distance on design from the top face of the optical semiconductor element (5) to the center of the active layer (4) of the optical semiconductor element (5); holding the optical semiconductor element (5) in a junction-up state at an approach start position isolated from the mount face (6), and bringing down the optical semiconductor element (5) closer to the mount face (6) to the height where the top-face height of the optical semiconductor element (5) is aligned with the height of the surface (3a) on the waveguide forming face side of the planar lightwave circuit (3); and crushing the solder layer (7) between the mount face (6) and the optical semiconductor element (5) by bringing the optical semiconductor element (5) towards the mount face (6) for an amount of the difference "(A–B)" between the reference value "A" of the distance on design from the surface (3a) on the waveguide forming face side of the planar lightwave circuit (3) to the center of the waveguide (2) of the planar lightwave circuit (3) and the reference value "B" of the distance on design from the top face of the optical semiconductor element (5) to the center of the active layer (4) of the optical semiconductor element (5) to mount the optical semiconductor element (5) on the planar lightwave circuit (3).

(Supplementary Note 2)

The manufacturing method of the laser module (1) depicted in Supplementary Note 1, which includes: acquiring the top-face height "R1" of the optical semiconductor element (5) and the height "L1" of the surface (3a) on the waveguide forming face side of the planar lightwave circuit (3) in a state where the optical semiconductor element (5) is held at the approach start position; subtracting the height "L1" of the surface (3a) on the waveguide forming face side of the planar lightwave circuit (3) from the top-face height "R1" of the optical semiconductor element (5), and further adding a value acquired by subtracting a reference value "B" of a distance on design from the top face of the optical semiconductor element (5) to the center of the active layer (4) of the optical semiconductor element (5) from a reference value "A" of a distance on design from the surface (3a) on the waveguide forming face of the planar lightwave circuit (3) to the center of the waveguide (2) of the planar lightwave circuit (3) to acquire a distance "(R1–L1)+(A–B)" for which the optical semiconductor element (5) is to be brought closer to the mount face (6); and continuously bringing the optical semiconductor element (5) closer towards the mount face (6) for the acquired distance "(R1–L1)+(A–B)".

(Supplementary Note 3)

The manufacturing method of the laser module (1) depicted in Supplementary Note 1, which includes: starting an approaching movement of the optical semiconductor element (5) towards the mount face (6) in a state where the optical semiconductor element (5) is held at the approach start position; detecting that the height of the surface (3a) on the waveguide forming face side of the planar lightwave circuit (3) is aligned with the top-face height of the optical semiconductor element (5); and then making an approaching movement of the optical semiconductor element (5) towards the mount face (6) further from that position for a distance corresponding to a value "(A–B)" acquired by subtracting the reference value "B" of the distance on design from the top face of the optical semiconductor element (5) to the center of the active layer (4) of the optical semiconductor element (5) from the reference value "A" of the distance on design from the surface (3a) on the waveguide forming face side of the planar lightwave circuit (3) to the center of the waveguide (2) of the planar lightwave circuit (3).

(Supplementary Note 4)

A laser module (1) including an optical semiconductor element (5) constituting a part of the laser module (1) mounted via a solder layer (7) on a mount face (6) that is formed on a planar lightwave circuit (3) by notching a part of the planar lightwave circuit (3) constituting other part of the laser module (1) from a surface (3a) on a waveguide forming face side of the planar lightwave circuit (3) towards a normal direction thereof, wherein: the mount face (6) is formed by notching the planar lightwave circuit (3) along depth of a value acquired by adding a reference thickness "X" of the optical semiconductor element (5) on design from the surface (3a) on the waveguide forming face side of the planar lightwave circuit (3) where the waveguide (2) is formed, a reference thickness "Y" of the solder layer (7) on design, and a difference "(A–B)" between a reference value "A" of a distance on design from the surface (3a) on the waveguide forming face side of the planar lightwave circuit (3) to the center of the waveguide (2) of the planar lightwave circuit (3) and a reference value "B" of a distance on design from the top face of the optical semiconductor element (5) to the center of the active layer (4) of the optical semiconductor element (5); and on the mount face (6), the optical semiconductor element (5) is mounted in a junction-up state via the solder layer (7) with thickness under a crushed state equivalent to the reference thickness "Y" on design in such a manner that top-face height of the optical semiconductor element (5) is lower than the height of the surface (3a) on the waveguide forming face side of the planar lightwave circuit (3) for an amount of the difference "(A–B)" between the reference value "A" of the distance on design from the surface (3a) on the waveguide forming face side of the planar lightwave circuit (3) to the center of the waveguide (2) of the planar lightwave circuit (3) and the reference value "B" of the distance on design from the top face of the optical semiconductor element (5) to the center of the active layer (4) of the optical semiconductor element (5).

INDUSTRIAL APPLICABILITY

The present invention can be applied for manufacturing a laser module constituted with a planar lightwave circuit and an optical semiconductor element.

What is claimed is:

1. A manufacturing method of a laser module in which an optical semiconductor element constituting a part of the laser module is mounted, via a solder layer, on a mount face that is formed on a planar lightwave circuit by notching a part of the planar lightwave circuit constituting another part of the laser module from a surface on a waveguide forming face side of the planar lightwave circuit towards a normal direction thereof so as to align height of an active layer of the optical semiconductor element and height of a waveguide of the planar lightwave circuit in the normal direction of the waveguide forming face side, the method including:

forming the mount face by notching the planar lightwave circuit along depth of a value acquired by adding a reference thickness of the optical semiconductor element on design from the surface on the waveguide forming face side of the planar lightwave circuit where the waveguide is formed, a reference thickness of the solder layer on design, and a difference between a reference value of a distance on design from the surface on the waveguide forming face side of the planar lightwave circuit to the center of the waveguide of the planar lightwave circuit and a reference value of a distance on design from the top face of the optical semiconductor element to the center of the active layer of the optical semiconductor element;

holding the optical semiconductor element in a junction-up state at an approach start position isolated from the mount face, and bringing down the optical semiconductor element closer to the mount face to height where top-face height of the optical semiconductor element is aligned with height of the surface on the waveguide forming face side of the planar lightwave circuit; and crushing the solder layer between the mount face and the optical semiconductor element by bringing the optical semiconductor element towards the mount face by a distance that is the difference between the reference value of the distance on design from the surface on the waveguide forming face side of the planar lightwave circuit to the center of the waveguide of the planar lightwave circuit and the reference value of the distance on design from the top face of the optical semiconductor element to the center of the active layer of the optical semiconductor element to mount the optical semiconductor element on the planar lightwave circuit.

2. The manufacturing method of the laser module as claimed in claim 1, comprising:

acquiring top-face height of the optical semiconductor element and height of the surface on the waveguide forming face side of the planar lightwave circuit in a state where the optical semiconductor element is held at the approach start position;

subtracting the height of the surface on the waveguide forming face side of the planar lightwave circuit from the top-face height of the optical semiconductor element, and further adding a value acquired by subtracting a reference value of a distance on design from the top face of the optical semiconductor element to the center of the active layer of the optical semiconductor element from a reference value of a distance on design from the surface on the waveguide forming face of the planar lightwave circuit to the center of the waveguide of the planar lightwave circuit to acquire the distance for which the optical semiconductor element is to be brought closer to the mount face; and continuously bringing the optical semiconductor element closer towards the mount face for the acquired distance.

3. The manufacturing method of the laser module as claimed in claim 1, comprising:

starting an approaching movement of the optical semiconductor element towards the mount face in a state where the optical semiconductor element is held at the approach start position;

detecting that the height of the surface on the waveguide forming face side of the planar lightwave circuit is aligned with the top-face height of the optical semiconductor element;

and then making an approaching movement of the optical semiconductor element towards the mount face further from that position for a distance corresponding to a value acquired by subtracting the reference value of the distance on design from the top face of the optical semiconductor element to the center of the active layer of the optical semiconductor element from the reference value of the distance on design from the surface on the waveguide forming face side of the planar lightwave circuit to the center of the waveguide of the planar lightwave circuit.

4. A laser module including an optical semiconductor element constituting a part of the laser module mounted via a solder layer on a mount face that is formed on a planar lightwave circuit by notching a part of the planar lightwave circuit constituting other part of the laser module from a surface on a waveguide forming face side of the planar lightwave circuit towards a normal direction thereof, wherein:

the mount face is formed by notching the planar lightwave circuit along depth of a value acquired by adding a reference thickness of the optical semiconductor element on design from the surface on the waveguide forming face side of the planar lightwave circuit where the waveguide is formed, a reference thickness of the solder layer on design, and a difference between a reference value of a distance on design from the surface on the waveguide forming face side of the planar lightwave circuit to the center of the waveguide of the planar lightwave circuit and a reference value of a distance on design from the top face of the optical semiconductor element to the center of the active layer of the optical semiconductor element; and on the mount face, the optical semiconductor element is mounted in a junction-up state via the solder layer with thickness under a crushed state equivalent to the reference thickness on design in such a manner that top-face height of the optical semiconductor element is lower than the height of the surface on the waveguide forming face side of the planar lightwave circuit by a distance that is the difference between the reference value of the distance on design from the surface on the waveguide forming face side of the planar lightwave circuit to the center of the waveguide of the planar lightwave circuit and the reference value of the distance on design from the top face of the optical semiconductor element to the center of the active layer of the optical semiconductor element.

\* \* \* \* \*